(12) United States Patent
Koester

(10) Patent No.: US 9,612,429 B2
(45) Date of Patent: Apr. 4, 2017

(54) CIRCUIT AND METHOD FOR CONTROLLING A MICROSCOPE

(71) Applicant: LEICA MICROSYSTEMS CMS GMBH, Wetzlar (DE)

(72) Inventor: Thorsten Koester, Edingen-Neckarhausen (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 905 days.

(21) Appl. No.: 13/894,503

(22) Filed: May 15, 2013

(65) Prior Publication Data

US 2013/0307958 A1 Nov. 21, 2013

(30) Foreign Application Priority Data

May 18, 2012 (DE) .................. 10 2012 208 324

(51) Int. Cl.
| | |
|---|---|
| *H04N 7/18* | (2006.01) |
| *H04N 9/47* | (2006.01) |
| *G02B 21/36* | (2006.01) |
| *G02B 21/00* | (2006.01) |
| *H01J 37/22* | (2006.01) |
| *H01J 37/28* | (2006.01) |

(52) U.S. Cl.
CPC ......... *G02B 21/365* (2013.01); *G02B 21/008* (2013.01); *H01J 37/224* (2013.01); *H01J 37/28* (2013.01)

(58) Field of Classification Search
CPC .................................................. G02B 21/365
USPC .............. 348/79; 356/318; 377/64; 359/368
See application file for complete search history.

(56) References Cited

U.S. PATENT DOCUMENTS

| | | | |
|---|---|---|---|
| 5,889,982 A | 3/1999 | Rodgers et al. | |
| 2003/0202177 A1* | 10/2003 | Reznichenko | G01M 11/005 356/237.1 |
| 2005/0110994 A1 | 5/2005 | Foster et al. | |
| 2009/0213981 A1 | 8/2009 | Bi et al. | |

* cited by examiner

*Primary Examiner* — Paulos M Natnael
*Assistant Examiner* — Omer Khalid
(74) *Attorney, Agent, or Firm* — Leydig, Voit & Mayer, Ltd.

(57) ABSTRACT

A circuit for controlling a microscope using a controller includes a slow memory configured to store control information. The controller is configured to control microscope parameters based on the control information. The circuit includes a data loader and at least two fast memories. The data loader is configured such that control information is written from the slow memory alternately into one of the at least two fast memories. The circuit also includes a multiplexer configured to permit access by the controller to one of the at least two fast memories in alternating fashion so as to read control information. The data loader is configured to control the multiplexer in such a way that a write operation by the data loader and a read operation by the controller will not occur simultaneously on the same fast memory.

14 Claims, 2 Drawing Sheets

CIRCUIT AND METHOD FOR CONTROLLING A MICROSCOPE

CROSS REFERENCE TO RELATED APPLICATIONS

This application claims priority to German Patent Application No. DE 10 2012 208 324.3, filed May 18, 2012, which is hereby incorporated by reference herein in its entirety.

FIELD

The present invention relates to circuits for controlling a microscope by means of a controller, the circuit having a slow memory for storing control information, and the controller being configured for controlling microscope parameters based on the control information. The control information items can be accessed by the controller via n lines. Each line provides one channel for control information.

The present invention further relates to methods for controlling a microscope by means of a controller.

BACKGROUND

At present, commonly used microscopes often have a controller capable of controlling the microscope. Controllable parameters include, for example, an illuminating laser beam of the microscope, individual wavelengths or wavelength bands of the illuminating laser beam, controllable beam splitters in the optical path of the microscope, and the detection device. Some of the parameters remain constant for a relatively long period of time, whereas other parameters change very quickly.

One particular application is in confocal microscopes. In confocal microscopes, a sample is typically scanned in a meander pattern along image lines. To this end, an illuminating laser beam is directed onto the sample, and the detection light beam coming from sample is detected by a detection device. The detection light beam may be produced by reflection of the illuminating laser beam at the sample or by fluorescence effects. When a sample is scanned unidirectionally, the detection light beam is detected only during movement of the illuminating laser beam in one direction. When scanning is performed bidirectionally, the detection light beam is detected during movement of the illuminating laser beam in both directions. Depending on the design of the confocal microscope, up to 8,000 lines per second (and more) can be scanned in unidirectional mode, and up to 16,000 lines per second (and more) can be scanned in bidirectional mode.

When living samples are examined, care must be taken not to deliver too much energy to the sample during a scanning operation in order not to destroy the sample. Therefore, so-called regions of interest (ROI) are defined in sample regions which are expected to be of interest and in which the illuminating light beam is activated. A controller activates the illuminating laser beam based on the position of the image points to be illuminated. To this end, control information is made available to the controller, on the basis of which the controller controls a parameter of the microscope, in this case the illuminating laser beam.

A circuit for controlling a microscope, as known in the prior art, is schematically shown in FIG. 1. The circuit of FIG. 1 has a slow memory in the form of, for example, a double data rate random access memory (DDR-RAM). A data loader B sends an address to slow memory A, requesting control information stored at that address, and receives control information from slow memory A. This control information is stored in a fast memory C, which may be in the form of a hardware register. Fast memory C is typically implemented as a line buffer; i.e., fast memory C contains the control information for all image points of an image line during illumination of the sample. The control information stored in fast memory C can be retrieved by a controller D and used for controlling the microscope. Writing into the fast memory is in principle only possible while it is not being read.

The control information for one image point typically includes a plurality elements. In a confocal microscope marketed by the applicant, 64 individual bits are stored as control information for one image point and evaluated by the controller. One bit may control, for example, whether an illuminating laser beam or an illuminating laser line is on or off at an image point.

During operation of the circuit shown in FIG. 1, the control information for one line is loaded from the slow memory into the fast memory between active phases of two image lines. Generally, the illuminating laser beam is scanned across the sample at a constant velocity within the scan region. When the illuminating laser beam leaves the scan region, the illuminating laser beam is decelerated and returned in the opposite direction on the next image line to the beginning of the scan region. When scanning is performed bidirectionally, the next image line is scanned as the illuminating laser beam is returned across the sample. When the scanning is unidirectional, the laser beam is returned while in the OFF state, the direction is changed, and the next image line is not scanned until the illuminating laser beam moves back. This results in scan pauses between the completion of the scanning of an image line and the repositioning of the illuminating laser beam. These scan pauses are used for loading control information into the fast memory.

The prior art circuit is problematic because large volumes of data must be loaded from the slow memory into the fast memory within a short period of time. To this end, the individual elements of the circuit must be sufficiently fast in order for the loading operation to be completed when the loaded control information is to be accessed at the beginning of the next image line. If the volume of data to be loaded increases, for example, because the control information to be handled by a channel is not just binary information, but rather is control information having a resolution of several bits, the prior art circuit fails. If the speed of the circuit cannot or should not be further increased, the scanning speed must be reduced; i.e., the time for the loading operation must be increased by longer pauses between the scanning of two image lines.

SUMMARY

In an embodiment, the present invention provides a circuit for controlling a microscope using a controller includes a slow memory configured to store control information. The controller is configured to control microscope parameters based on the control information. The circuit includes a data loader and at least two fast memories. The data loader is configured such that control information is written from the slow memory into the at least two fast memories in alternating fashion. The circuit also includes a multiplexer configured to permit access by the controller to the at least two fast memories in alternating fashion so as to read control information. The data loader is configured to control the multiplexer in such a way that a write operation by the data loader and a read operation by the controller will not occur simultaneously on the same fast memory.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
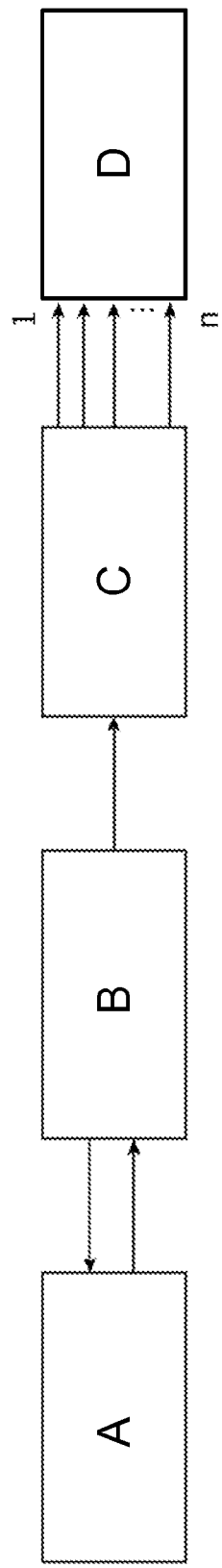
FIG. 1 is a schematic view of a circuit for controlling a microscope according to the prior art.

An aspect of the present invention is to improve a circuit and method of the type mentioned in the background in such a way that large volumes of data can be handled and made available to the controller within a short period of time. Moreover, the circuit and method disclosed herein should be as scalable as possible.

In an embodiment, the present invention provides a circuit that includes a data loader and at least two fast memories, the data loader being configured such that control information is written from the slow memory alternately into one of the at least two fast memories;

in that the circuit has a multiplexer which allows the controller to access one of the at least two fast memories in alternating fashion to read control information; and in that the data loader is configured to control the multiplexer in such a way that a write operation by the data loader and a read operation by the controller will not occur simultaneously on the same fast memory.

In another embodiment the present invention provides a circuit in which m separate data loaders are provided, each having a fast memory associated therewith, where 1≤m<n, and where each of the data loaders is assigned to one microscope parameter to be controlled;

in that the data loaders are configured such that the portion of control information that is loaded into the respective fast memory is the portion which represents the microscope parameter that is to be controlled by the respective data loader; and in that the circuit has a switching matrix which allows the control information stored in the m fast memories to be accessed by the controller via n lines.

In another embodiment, the present invention provides a method in which the steps of:

loading, by a data loader, control information from a slow memory;

writing, by the data loader, the control information alternately into one of at least two fast memories;

switching a multiplexer such that a read access to one of the at least two fast memories is enabled in such a manner that the data loader will not write into the respective fast memory at the same time;

accessing, by a controller, the selected fast memory through the multiplexer and reading out the stored control information; and controlling, by the controller, the microscope based on the read control information.

In another embodiment the present invention provides a method that includes the steps of:

loading, by each of m separate data loaders, control information concerning a respective one of m microscope parameters to be controlled;

writing, by the respective data loader, the control information into a fast memory associated with the respective data loader;

accessing, by a controller, the control information stored in the fast memories through a switching matrix;

reading, by the controller, the control information from the fast memories through the switching matrix; and controlling, by the controller, the microscope based on the read control information.

In accordance with the present invention, it was found, first of all, that data throughput can be improved in that the operations for loading the control information from the slow memory into the fast memory are distributed among a plurality of fast memories. Thus, loading operations can be optimized and controlled more efficiently. This idea, which forms the basis of the present invention, can be implemented in two different ways. Firstly, the plurality of fast memories may be served by one common data loader. Secondly, a plurality of separate data loaders may be provided, each having a fast memory associated therewith.

For the first embodiment, the circuit includes one data loader communicatingly connected to at least two fast memories. The data loader is configured to write control information stored in the slow memory into one of the plurality of fast memories in alternating fashion. In order for the control information stored in the respective fast memory to be read out therefrom, the circuit includes a multiplexer which allows the controller to access one of the at least two fast memories in alternating fashion to read control information. The data loader controls the write operations into the fast memories and the multiplexer in such a way that a write operation by the data loader and a read operation by the controller will not occur simultaneously on the same fast memory. By coordinating the write and read operations, the data loader can always ensure that the controller is able to read the correct control information (e.g., for an image line), and that control information is only written into the fast memory while the controller is unable to read data from this fast memory. Thus, the write and read operations are decoupled from one another, and a longer pause can be used for loading the control information. Also, instead of using only the short period of time between active phases of two successive image lines for loading the control information into a fast memory, control information can be loaded into a fast memory during the period of time required for repositioning the illuminating laser beam, scanning at least one image line (depending on the number of fast memories), and a further repositioning of the illuminating laser beam. This results in an appreciable distribution of the load requests targeted at the slow memory.

In order to make assess to the control information as easy as possible, the data loader preferably controls the loading operation into the individual fast memories in such a way that control information items which can be grouped are stored in a common fast memory. This may be accomplished, for example, in that the control information for one line of an image to be scanned by the microscope is stored in one of the fast memories at any one time. Thus, firstly, the addressing during loading and write operations is simplified and, secondly, the multiplexer can be implemented using lower-speed circuit elements and does not need to switch back and forth at a very high frequency between the individual fast memories. On the other hand, the write operation can be coordinated more easily because the data loader does not need to have detailed information about the control information that is currently being requested by the controller.

Preferably, control information defining the required settings of the microscope parameter or parameters is stored in the fast memories for each image point to be scanned by the microscope. The individual parameters may be in the form of binary information, such as "ON" or "OFF". On the other hand, the control information for a parameter may contain various intermediate states in the form of information items having a width of several bits. Thus, for example, a 4-bit or 8-bit wide information item may be stored in a control information channel. In principle, it is also possible that control information items having different bit widths are stored in the individual channels.

For purposes of coordinating the loading operations and the switching of the multiplexer, the data loader could have inputs through which information about the current status of the scanning operation is transferred to the data loader. In this way, the data loader could receive information indicating that the beginning of an image, the end of an image, the beginning of a line and/or the end of a line has been reached.

Thus, for example, by signaling the end of a line, the data loader could be informed that the control information in the fast memory currently selected by the multiplexer is no longer needed and may therefore be overwritten by new control information to be loaded from the slow memory. The end of a line also indicates that the multiplexer must be switched to another fast memory within a defined period of time, namely the time until the next scan line begins.

By signaling the beginning of a line, the data loader receives information indicating that a fast memory, namely the one that is currently addressed by the multiplexer, can no longer be written to. This is because at the beginning of a line, the controller accesses the fast memory that is currently addressed by the multiplexer, and reads control information for the current scan line from the fast memory. Since, due to the relatively strict real-time requirements to be met by the circuit, simultaneous write and read operations are not allowed, the data loader can no longer write into the respective fast memory.

By signaling the end of an image, the data loader is informed that no control information will be read out by the controller for a relatively long period of time. This relatively long period of time is due to the movement of the illuminating laser beam to a starting point at which scanning of a new image begins. During this period, the data loader can attempt to load as much control information as possible from the slow memory into the fast memory. In this way, the plurality of memories can be "filled up" again and emptied, possibly successively, during the scanning of an image. It may happen, for example, that toward the end of the scanning of an image, the filling of the fast memory by the data loader is not completed until shortly before the access to this memory starts, and that not all of the plurality of fast memories are filled with updated control information anymore. In particular, when three or more fast memories are used, it may even happen that individual fast memories "become obsolete" during the scanning of an image.

By signaling the beginning of an image, the data loader can be informed that a new scanning operation is started.

Preferably, one microscope parameter to be controlled is a laser light source or a laser line of a laser light source. The microscope to be controlled may, for example, have a plurality of laser light sources with different wavelengths or one laser light source with a plurality of different wavelengths. One parameter would then, for example, be whether or not, and possibly with which intensity, one or more laser light sources are turned on or one or more laser lines of one laser light source are activated.

This applies similarly to the second embodiment of the idea underlying the invention. According to this second embodiment, the circuit includes a plurality of separate data loaders that are each capable of accessing a fast memory. It has been found that in most of the common microscopy experiments, not all of the n parameters that are in principle controllable via the control information are actually used. Instead, it is usually sufficient to control m parameters for the microscope during an experiment. Accordingly, for each of these microscope parameters to be controlled, a separate data loader is used in the circuit. Thus, each data loader is assigned to one definable microscope parameter to be controlled. The assignment of the individual parameters to a data loader can be flexibly defined at the beginning of an experiment. The data loaders are configured such that only that portion of the control information which represents the microscope parameter to be controlled by a particular data loader will be loaded into the respective fast memory. In this way, only m information items out of the entire set of information items are loaded, so that the amount of data is reduced and also distributed among m different fast memories. Thus, the idea of a distribution among a plurality of fast memories, which forms the basis of the present invention, is also implemented in this way.

Since the controller expects to receive the control information via n lines, the circuit of the second embodiment includes a switching matrix which allows the controller to access the control information stored in the m fast memories. Thus, the loading of the control information can be made fully transparent and also highly flexible for the controller. As regards the function of the circuit of the present invention, the controller is unable to notice any difference between the prior art circuit and the circuit according to the present invention. However, because the loading of the control data is implemented in a better structured way, the circuit of the present invention is significantly faster and more flexible.

In a preferred embodiment of the switching matrix, the lines connecting the switching matrix to one of the m fast memories are connected by the switching matrix to one or more of the n lines to the controller. In this way, the m control information items can be switched to one or more of the n control channels. This adds further flexibility.

The switching matrix is preferably programmable, so that the interconnection between the lines to one of the m fast memories and one or more of the n lines to the controller can be changed. Thus, the parameters to be controlled can be changed between two scanning operations and adapted to the particular experiment.

In order to control the competing accesses by the m data loaders to the slow memory, an arbiter could be provided which controls the individual read accesses. In a simple embodiment, the arbiter could organize the individual read requests in a queue and process them one after the other. Accordingly, a read request would be placed in the queue until all previously received read requests have been processed. This provides a very simple way to prevent multiple simultaneous accesses to the slow memory. On the other hand, the arbiter could pursue load balancing strategies, by which the accesses to the slow memory can be controlled according to certain priorities to be defined.

Preferably, 32 or more channels are provided for the access of the controller to the control information in the fast memory. This makes it possible to receive control information via n=32 lines. Particularly preferably, n is selected as n>=64, so that 64 channels are provided for receiving control information. In an especially preferred embodiment, 74 such control channels are provided.

On the other hand, m; i.e., the number of parameters to be controlled is preferably selected to be 16 or more. Particularly preferably, the number of parameters to be controlled simultaneously is less or equal to 12, and in a particularly preferred embodiment less than or equal to 8.

The data loaders may be configured such that the loading of the control information takes place between active phases of a scanning process. The active phases are created by the scanning of two image lines. The loading time is defined by the period of time during which, after the scanning of an image line ends, the laser is repositioned for scanning the next image or the next image line. During this time, it is possible to ensure that none of the fast memories is accessed.

In the second embodiment of the idea underlying the invention, the microscope parameters to be controlled may also include a laser light source or a laser line of a laser light source.

In another preferred embodiment of the inventive idea, the first and second embodiments may be combined. According to this embodiment, each data loader would have at least two fast memories associated therewith, each data loader being configured to write to one of the fast memories in alternating fashion. A multiplexer controlled by the data loader allows the controller to alternately access one of the at least two fast memories associated with the data loader. In the process, the controller accesses the particular addressed fast memory through the switching matrix and the multiplexer. The data loader is configured to control the multiplexer in such a way that a write access by the respective data loader and a read access by the controller will not occur simultaneously on the same fast memory. Thus, the loading operation can be further optimized, and the slow memory can be read more efficiently.

Figure 2:
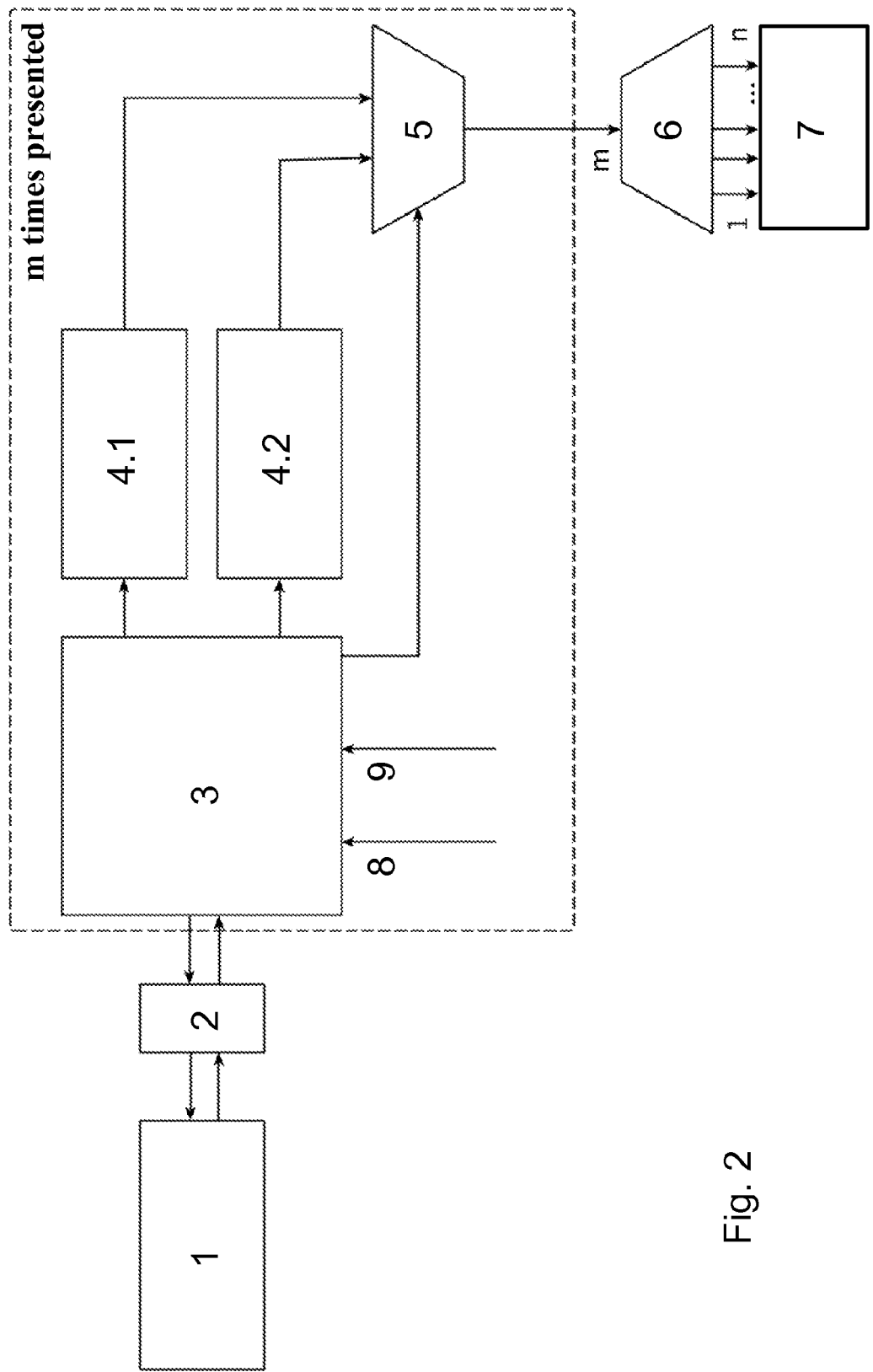
FIG. 2 is a schematic view of a circuit for controlling a microscope according to the present invention, which has m data loaders and two fast memories per data loader.

FIG. 2 shows, in schematic form, a circuit for controlling a microscope, according to the present invention, which combines both aspects of the invention. Firstly, a plurality of data loaders are implemented and, secondly, each data loader has two fast memories associated therewith.

The circuit of FIG. 2 has a slow memory 1 in which is stored control information for controlling the microscope. Slow memory 1 is accessed via an arbiter 2 which resolves competing accesses from m data loaders 3 by placing all read requests into a queue. For the sake of clarity, only one data loader 3 is shown along with the associated elements. However, all elements within the dashed line are present m times, each of these units being configured to access the control information for a microscope parameter.

Each data loader 3 is connected to two fast memories 4.1 and 4.2, into which data loader 3 writes control information from slow memory 1 in alternating fashion. The two fast memories 4.1 and 4.2 are, in turn, connected to a multiplexer 5, which is controlled by data loader 3 and which allows read access to one of the two fast memories 4.1 and 4.2 in alternating fashion. All m multiplexers, which are each connected to a respective one of the m data loaders, are combined via a switching matrix 6, and the control information items are made available at some of the n output lines. The configuration of switching matrix 6 defines which control information items are present at which of the n lines. In simplified terms, switching matrix 6 is a matrix of m×n lines. The connections between individual crossing lines define which of the m inputs are applied to which of the n outputs. Via the n output lines, controller 7 can access the control information for one of the m microscope parameters in one of fast memories 4.1 and 4.2.

The data loader additionally has two inputs 8 and 9, via which data loader 3 may be informed that the end of an image (input 8) or the end of a line (input 9) has been reached.

During operation of the circuit of FIG. 2, control information for the m microscope parameters is stored in slow memory 1. In this connection, on the one hand, the memory may have stored therein control information items which have been pre-selected for the respective m parameters to be controlled. On the other hand, the data loader may filter out the control information items that are required for the desired m parameters from all of the n possible control information items. In order to load the corresponding control information items, data loader 3 sends a request containing the address of the desired control information item to arbiter 2, which inserts the request into a queue and forwards the first received request to slow memory 1 at any one time. Slow memory 1 returns the requested control information to arbiter 2 which, in turn, transmits the received data to the requesting data loader 3. Data loader 3 stores the received control information into one of fast memories 4.1 and 4.2.

Assuming that data loader 3 has currently switched multiplexer 5 such that fast memory 4.2 can be accessed at the output of the multiplexer (i.e., in the direction of switching matrix 6), then the data loader stores the individual control information items into fast memory 4.1 In doing so, all control information items which, for each point of a line of an image to be scanned, define the microscope parameter that is assigned to data loader 3 are stored in fast memory 4.1. Once all control information for the respective parameter is stored in fast memory 4.1, data loader 3 is ready to switch the multiplexer. Once input 9 receives a signal indicating the end of a line to be scanned, data loader 3 issues a control signal to multiplexer 5 which then switches its output to provide access to fast memory 4.1.

Subsequently, data loader 3 can fill fast memory 4.2 with control information. The data already contained in fast memory 4.1 is overwritten.

Once input 8 receives a signal indicating the end of an image; i.e., that the last line and the last image point within a scanning operation have been scanned, the data loader overwrites the contents of both memories 4.1 and 4.2 with new control information from slow memory 1. To further increase the buffering capacity of the individual data loaders 3, each of data loaders 3 may be associated with additional fast memories 4. The principle of operation of the circuit remains the same. Ultimately, the only limiting factor is the bandwidth available between the arbiter and slow memory 1. However, the available bandwidth can be used much more efficiently because the loading of the individual control information items is better distributed, and because now the bandwidth needs to be sufficient only on average. This results in an appreciable shift in the real-time requirements to be met by the overall circuit, and the throughput can be significantly increased and optimized.

With regard to further advantageous embodiments of the circuits and methods according to the present invention, and to avoid repetition, reference is made to the general part of the description and to the appended claims.

Finally, it should be particularly noted that the above-described exemplary embodiments of the circuit according to the present invention are merely intended to illustrate the claimed teaching, but not to limit it to such embodiments.

LIST OF REFERENCE NUMERALS

A slow memory
B data loader
C fast memory
D controller
1 slow memory
2 arbiter
3 data loader
4 fast memory
5 multiplexer
6 switching matrix
7 controller
8 input (end of image)
9 input (end of line)

What is claimed is:

1. A circuit for controlling a microscope via n control parameters using a controller, the circuit comprising:
 a memory configured to store control information;
 m separate data loaders, each data loader having a cache associated therewith and being assigned to one microscope parameter to be controlled; and
 a switching matrix configured to allow control information stored in the m caches to be accessed by the controller via n lines,
 wherein each of the m separate data loaders is configured to load, from the memory, a portion of control information which represents a respective microscope parameter to be controlled to which the respective data loader is assigned,
 wherein each of the n lines defines a control channel for the control information for controlling the microscope,
 wherein at least one data loader is connected to at leak two caches and configured to write to the at least two connected caches in alternating fashion,
 wherein the circuit further comprises a multiplexer which allows the controller to access one of the at least two connected caches in alternating fashion through the switching matrix to read control information, and
 wherein the at least one respective data loader is configured to control the multiplexer in such a way that a write operation by the respective data loader and a read operation by the controller will not occur simultaneously on the same cache.

2. The circuit as recited in claim 1, wherein the switching matrix comprises m inputs and n outputs,
 wherein the switching matrix defines a matrix of m×n crossing lines,
 wherein connections are provided for defining which of the m inputs is applied to which of the n outputs, and
 wherein the switching matrix connects lines leading to the m caches to the controller via one or more of the n lines.

3. The circuit as recited in claim 1, wherein the circuit includes an arbiter which controls competing accesses to the memory by the m data loaders.

4. The circuit as recited in claim 1, wherein n is greater than or equal to 32.

5. The circuit as recited in claim 4, wherein n is greater than or equal to 64.

6. The circuit as recited in claim 4, wherein n is greater than or equal to 74.

7. The circuit as recited in claim 1, wherein m is less than or equal to 16.

8. The circuit as recited in claim 7, wherein m is less than or equal to 12.

9. The circuit as recited in claim 7, wherein m is less than or equal to 8.

10. The circuit as recited in claim 1, wherein one microscope parameter to be controlled includes a laser light source or a laser line of a laser light source.

11. The circuit as recited in claim 1, wherein control information for one line of an image to be scanned by the microscope is stored in a cache at any one time.

12. A method for controlling a microscope via n control parameters using a controller, comprising the steps of:
 loading, from a memory into respective caches of each of m separate data loaders, control information which represents m microscope parameters to be controlled wherein at least one data loader is connected to at least two caches and configured to write to the at least two connected caches in alternating fashion;
 accessing, by the controller, the control information stored in the m caches through a switching matrix which allows the control information stored in the m caches to be accessed by the controller via n lines, each of the n lines defining a control channel for the control information for controlling the microscope and through a multiplexer which allows the controller to access one of the at least two connected caches in alternating fashion through the switching matrix;
 reading, by the controller, the control information from the first memories through the switching matrix and the multiplexer; and
 controlling, by the controller, the microscope based on the read control information,
 wherein the at least one respective data loader is configured to control the multiplexer in such a way that a write operation by the respective data loader and a read operation by the controller will not occur simultaneously on the same cache.

13. The circuit as recited in claim 1, wherein the control information for each image point to be scanned by the microscope defines how the microscope parameter or parameters are selected.

14. The circuit as recited in claim 1, wherein at least one of the data loaders has input via which the beginning of an image, the end of an image, the beginning of a line, and/or the end of a line are signaled.

* * * * *